(12) United States Patent
Arai et al.

(10) Patent No.: US 12,237,001 B2
(45) Date of Patent: Feb. 25, 2025

(54) APPARATUSES INCLUDING OUTPUT DRIVERS AND METHODS FOR PROVIDING OUTPUT DATA SIGNALS

(71) Applicant: MICRON TECHNOLOGY, INC., Boise, ID (US)

(72) Inventors: Tetsuya Arai, Sagamihara (JP); Shuichi Tsukada, Sagamihara (JP); Shun Nishimura, Sagamihara (JP); Yoshinori Matsui, Sagamihara (JP)

(73) Assignee: Micron Technology, Inc., Boise, ID (US)

( * ) Notice: Subject to any disclaimer, the term of this patent is extended or adjusted under 35 U.S.C. 154(b) by 164 days.

(21) Appl. No.: 17/700,289

(22) Filed: Mar. 21, 2022

(65) Prior Publication Data

US 2023/0170013 A1 Jun. 1, 2023

Related U.S. Application Data

(60) Provisional application No. 63/284,968, filed on Dec. 1, 2021.

(51) Int. Cl.
G11C 11/4096 (2006.01)
G11C 11/4093 (2006.01)
H03K 19/003 (2006.01)

(52) U.S. Cl.
CPC ...... *G11C 11/4096* (2013.01); *G11C 11/4093* (2013.01); *H03K 19/00384* (2013.01)

(58) Field of Classification Search
CPC .......... G11C 11/4093; G11C 11/4096
USPC .................................. 365/189.05
See application file for complete search history.

(56) References Cited

U.S. PATENT DOCUMENTS

| | | | |
|---|---|---|---|
| 10,693,460 B1* | 6/2020 | Takahashi | G11C 11/4093 |
| 2007/0171708 A1 | 7/2007 | Tedrow et al. | |
| 2013/0229861 A1 | 9/2013 | Ueda | |
| 2015/0028681 A1 | 1/2015 | Li | |
| 2015/0130367 A1* | 5/2015 | Bae | G09G 3/3233 |
| | | | 315/291 |
| 2017/0067954 A1* | 3/2017 | Kim | G01R 31/31715 |
| 2019/0027205 A1 | 1/2019 | Hollis et al. | |
| 2020/0342929 A1 | 10/2020 | Suzuki et al. | |

OTHER PUBLICATIONS

International Search Report & Written Opinion dated Mar. 29, 2023 for PCT Application No. PCT/US2022/080698.

* cited by examiner

*Primary Examiner* — Anthan Tran
(74) *Attorney, Agent, or Firm* — Dorsey & Whitney LLP

(57) ABSTRACT

Apparatuses including output drivers and methods for providing output data signals are described. An example apparatus includes a high logic level driver, a low logic level driver, and an intermediate logic level driver. The high logic level driver is provided a first voltage and provides a high logic level voltage to a data terminal when activated. The low logic level driver is provided a second voltage and provides a low logic level voltage to the data terminal when activated. The intermediate logic level driver is provided a third voltage having a magnitude that is between the first and second voltages, and provides an intermediate logic level voltage to the data terminal when activated. Each of the high, low, and intermediate logic level drivers are configured to be respectively activated based on one or more of a plurality of control signals.

22 Claims, 5 Drawing Sheets

APPARATUSES INCLUDING OUTPUT DRIVERS AND METHODS FOR PROVIDING OUTPUT DATA SIGNALS

CROSS-REFERENCE TO RELATED APPLICATION

This application claims the filing benefit of U.S. Provisional Application No. 63/284,968, filed Dec. 1, 2021. This application is incorporated by reference herein in its entirety and for all purposes.

BACKGROUND

The pursuit of making computing systems more powerful and more power efficient has led to advancement in interface communications to improve throughput without increasing, and ideally reducing, energy consumption. Often, as clock speeds increase, a desire to increase data transition times on interface busses to match the faster clock speeds exists. Future low power double data rate (LPDDR) dynamic random-access memory (DRAM) performance targets may eventually exceed DRAM transistor switching capabilities.

To address the limitations, some systems have implemented data encoding and special purpose, multi-level (e.g., more than two levels) communication between memory and the system. While utilizing multi-level communication may provide improved throughput, output data circuits, such as output drivers, that are used to provide multi-level data signals can be complex and increase power consumption.

As engineers continue to improve system performance, output drivers that may improve current consumption and do not significantly increase output data circuit complexity may be desirable.

DETAILED DESCRIPTION

Various embodiments of the present disclosure will be explained below in detail with reference to the accompanying drawings. The following detailed description refers to the accompanying drawings that show, by way of illustration, specific aspects in which embodiments of the present disclosure may be practiced. These embodiments are described in sufficient detail to enable those skilled in the art to practice the embodiments of present disclosure. Other embodiments may be utilized, and structure, logical and electrical changes may be made without departing from the scope of the present disclosure. The various embodiments disclosed herein are not necessary mutually exclusive, as some disclosed embodiments can be combined with one or more other disclosed embodiments to form new embodiments.

Certain details are set forth below to provide a sufficient understanding of embodiments of the disclosure. However, it will be clear to one skilled in the art that embodiments of the disclosure may be practiced without these particular details. Moreover, the particular embodiments of the present disclosure described herein are provided by way of example and should not be used to limit the scope of the disclosure to these particular embodiments. In other instances, well-known circuits, control signals, timing protocols, and software operations have not been shown in detail in order to avoid unnecessarily obscuring embodiments of the disclosure. Additionally, terms such as "couples" and "coupled" mean that two components may be directly or indirectly electrically coupled. Indirectly coupled may imply that two components are coupled through one or more intermediate components.

Figure 1:
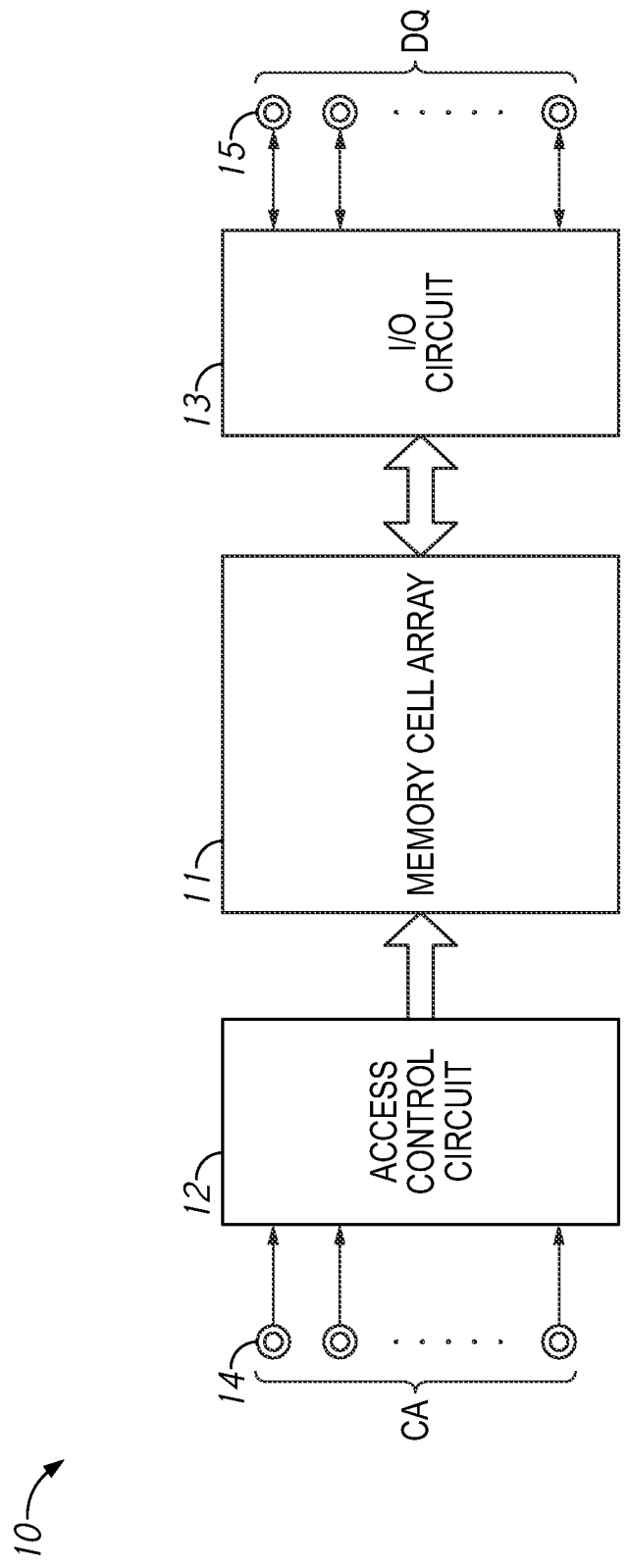
FIG. 1 is a block diagram showing a configuration of a semiconductor device according to an embodiment of the disclosure.

A semiconductor device 10 shown in FIG. 1 is a dynamic random access memory (DRAM) device. In some embodiments, the DRAM device is a Low-Power Double Data Rate (LPDDR) memory device. For example, the DRAM device may be a LPDDR5 DRAM device. The DRAM device may be other LPDDR DRAM devices as well, including LPDDR DRAM devices now known or later developed.

The semiconductor device 10 includes a memory cell array 11, an access control circuit 12 that provides access to the memory cell array 11, and an I/O circuit 13 that inputs data to and outputs data from the memory cell array 11. The access control circuit 12 provides access to the memory cell array 11 based on a command address signal CA input from an external controller via command address terminals 14. In a read operation, data DQ read out from the memory cell array 11 is output to data terminals 15 via the I/O circuit 13. In a write operation, data DQ input to the data terminals 15 from the external controller is provided to the memory cell array 11 via the I/O circuit 13.

The I/O circuit 13 includes an input buffer and an output buffer for each of the DQ terminals. The input buffer is used during a write operation to input write data DQ provided to the data terminals 15 that is to be written to the memory cell array 11. The output buffer is used during a read operation to provide data DQ read from the memory cell array 11 to the data terminals 15.

As will be described in more detail below, each of the output buffers of the I/O circuit 13 provides an output data signal having one of three voltage levels, corresponding to three different logic levels. The three different logic levels may be referred to as a high logic level, a low logic level, and an intermediate (middle) logic level (e.g., HIGH, LOW, and MID). The three different logic levels may be used in some embodiments to implement three level pulse amplitude modulation (PAM3).

Figure 2:
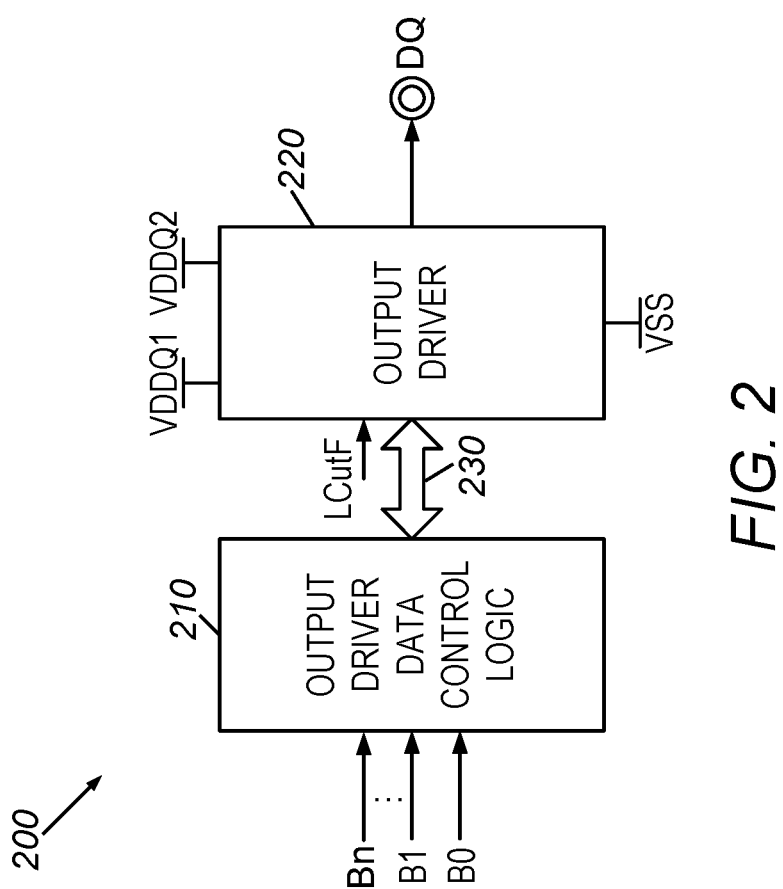
FIG. 2 is a block diagram of an output buffer according to an embodiment of the disclosure.

FIG. 2 is a block diagram of an output buffer 200 according to an embodiment of the disclosure. The output buffer 200 may be included in an I/O circuit. For example, in some embodiments of the disclosure, the output buffer 200 is included in the I/O circuit 13 of the semiconductor device 10 of FIG. 1.

The output buffer 200 includes an output driver data control logic 210 and an output driver 220. The output driver data control logic 210 is provided data as binary digits (bits) B0-Bn (n is a number greater than zero) and provides output driver data control signals 230 based on the data bits B0-Bn. The output driver data control signals 230 may be provided using logic operations performed by logic circuits included in the output driver data control logic 210. In some embodiments of the disclosure, the output driver data control logic 210 may be considered to translate, convert, encode, etc. the data bits B0-Bn to provide the output driver data control signals 230.

The data bits B0-Bn provided to the output driver data control logic 210 may be data bits read from a memory cell array, for example. Although FIG. 2 shows that the output driver data control logic 210 receives data bits B0-Bn in parallel, the scope of the disclosure is not limited to the data bits B0-Bn being provided in this manner. For example, in some embodiments of the disclosure, the data bits B0-Bn are provided serially to the output driver data control logic 210, with each data bit provided during a different interval of time. In other embodiments of the disclosure, the data bits B0-Bn are provided to the output driver data control logic 210 in a manner different than either in parallel or serially.

The output driver control signals 230 from the output driver data control logic 210 are provided to the output driver 220. The output driver 220 in turn provides an output data signal representing read data DQ corresponding to the data bits B0-Bn provided to the output driver data control logic 210. The output data signal provided by the output driver 220 may have one of three different logic levels, with each logic level corresponding to a different voltage level. The three different logic levels may be referred to as a high logic level, a low logic level, and an intermediate (middle) logic level (e.g., HIGH, LOW, and MID). The three different logic levels may be used in some embodiments to implement three level pulse amplitude modulation (PAM3).

The output driver 220 is further provided voltages VDDQ1, VDDQ2, and VSS. The VDDQ1 voltage is greater than the VDDQ2 voltage, and the VDDQ2 voltage is greater than the VSS voltage. That is, the VDDQ2 voltage is an intermediate voltage having a magnitude that is between the VDDQ1 voltage and VSS voltage. The voltages VDDQ1, VDDQ2, and VSS may be external voltages provided by a system to a device including the output buffer 200 for some embodiments of the disclosure.

Each of the voltages VDDQ1, VDDQ2, and VSS corresponds to a different one of the three logic levels of the output data signal provided by the output driver 220. For example, an output data signal having the VDDQ1 voltage may correspond to high logic level output data. Similarly, an output data signal having the VSS voltage may correspond to low logic level output data, and an output data signal having the VDDQ2 voltage may correspond to intermediate logic level output data. The output driver 220 is further provided a control signal LCutF that is used to cutoff one or more of the voltages from one or more circuits of the output driver when active (e.g., active when the LCutF signal is a low level "0"). The LCutF signal is inactive (e.g., inactive when the LCutF signal is high level "1") during operation of the output driver 220, such as when the output driver 220 is providing an output data signal having one of three logic levels (e.g., HIGH logic level, LOW logic level, or MID logic level). The LCutF signal may be provided by control circuits, such as control circuits included in the access control circuit 12 of the semiconductor device 10 of FIG. 1.

In some embodiments of the disclosure, the output driver data control logic 210 receives three bits of data B0-B2 and provides output driver data control signals 230 based on the three data bits B0-B2 to the output driver 220. The output driver 220 in turn provides an output data signal that represents the three data bits B0-B2. For example, the output data signal may have a voltage level for each unit interval (UI) of output data that corresponds to respective logic level, and the three data bits B0-B2 are represented by the combination of logic levels of the output data signal for more than one UI of output data.

Table 1 shows an example of representing three data bits B0-B2 with two UIs of output data where the output data is one of three logic levels.

TABLE 1

| 3-bit data (B2:B0) | Logic level for unit interval T0 | Logic level for unit interval T1 |
| --- | --- | --- |
| 000 | LOW | LOW |
| 001 | LOW | MID |
| 010 | LOW | HIGH |
| 011 | MID | LOW |
| Reserved | MID | MID |
| 100 | MID | HIGH |
| 101 | HIGH | LOW |
| 110 | HIGH | MID |
| 111 | HIGH | LOW |

The example of Table 1 is the PAM3 encoding for the 100BASE-T1 standard.

With reference to FIG. 2, in operation for the present example of three data bits and two UIs of a PAM3 output data signal, three data bits B0-B2 are received by the output driver data control logic 210. The output driver data control logic 210 provides output driver data control signals 230 based on the data bits B0-B2 to control the output driver 220 to provide an output data signal having a combination of logic levels for two unit intervals that correspond to the three data bits B0-B2. For example, when the output driver data control logic 210 receives data bits 101, the output driver data control logic 210 provides output driver data control signals 230 to control the output driver 220 to provide an output data signal having a HIGH logic level for a first unit interval (T0) and having a LOW logic level for a second unit interval (T1). For another three data bits the output driver data control logic 210 receives, the output driver data control logic 210 provides output driver data control signals based on the three new data bits to control the output driver 220 to provide the output data signal having a combination of logic levels for two unit intervals that correspond to the three new data bits. The output driver data control logic 210 and the output driver 220 continues to operate in this manner as additional three new data bits B0-B2 are received by the output driver data control logic 210.

Figure 3:
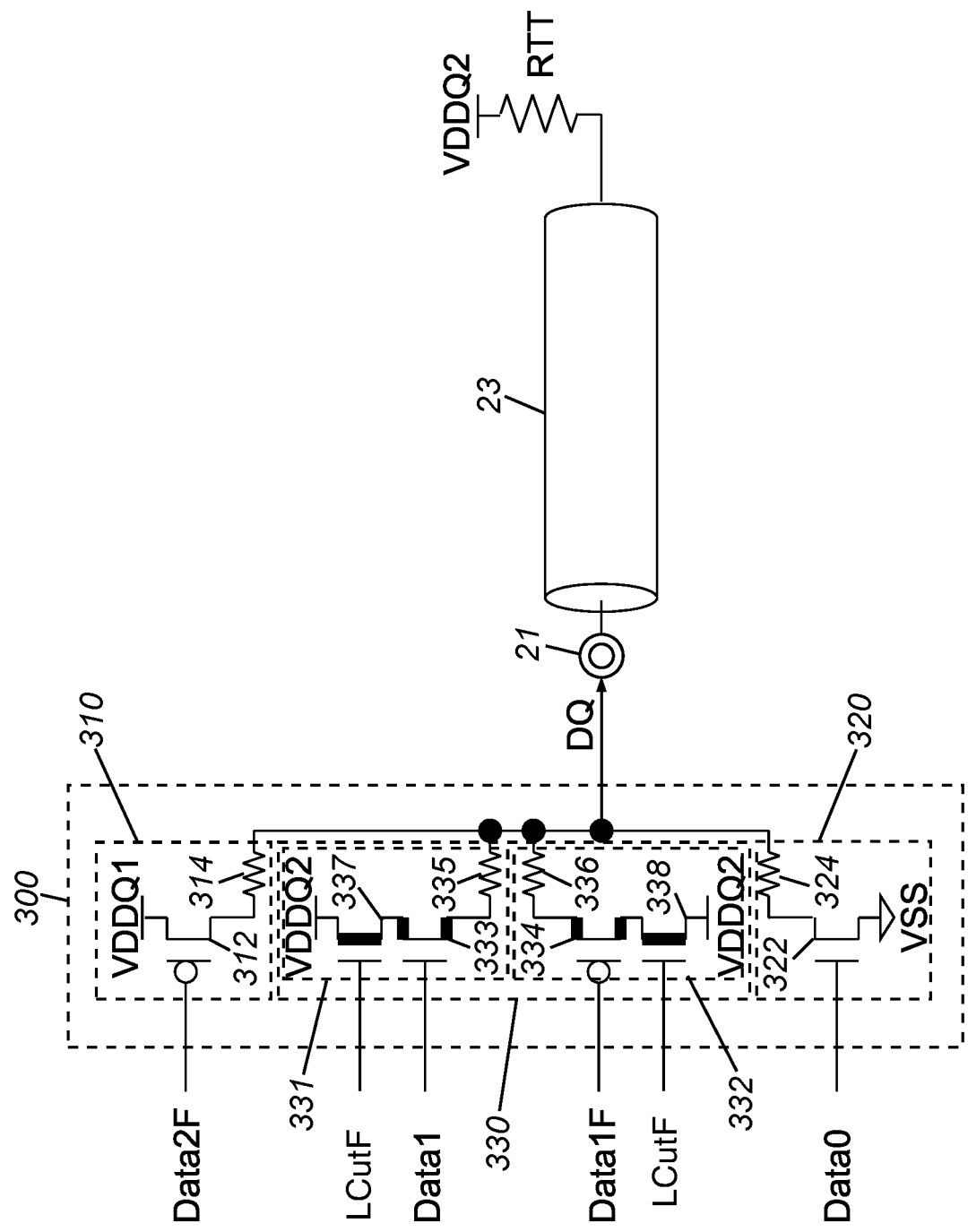
FIG. 3 is a diagram of an output driver according to an embodiment of the disclosure.

FIG. 3 is a diagram of an output driver 300 according to an embodiment of the disclosure. The output driver 300 may be included in an output buffer. For example, in some embodiments of the disclosure, the output driver 300 is included as the output driver 220 in the output buffer 200 of FIG. 2.

The output driver 300 includes a high logic level driver 310, a low logic level driver 320, and an intermediate logic level driver 330. The high logic level driver 310, the low logic level driver 320, and the intermediate logic level driver 330 are coupled to a data terminal 21. The high logic level driver 310 is provided a voltage VDDQ1, and the low logic level driver 320 is provided a voltage VSS. The intermediate logic level driver 330 is provided a voltage VDDQ2. In some embodiments of the disclosure, the VDDQ1 voltage is greater than the VDDQ2 voltage, and the VDDQ2 voltage is greater than the VSS voltage. That is, the VDDQ2 voltage is an intermediate voltage that is between the VDDQ1 voltage and VSS voltage.

The VDDQ1 voltage provided to the high logic level driver 310 may be used to provide an output data signal having a high logic level voltage that corresponds to high logic level output data. The VSS voltage provided to the low logic level driver 320 may be used to provide an output data signal having a low logic level voltage that corresponds to low logic level output data. The VDDQ2 voltage provided to the intermediate logic level driver 330 may be used to provide an intermediate logic level voltage that corresponds to intermediate logic level output data. In some embodiments of the disclosure, the voltage VDDQ1 is 1.0V, the voltage VSS is 0.0V, and the voltage VDDQ2 is 0.5V. However, in other embodiments the voltages VDDQ1, VSS, and VDDQ2 are different values. One or more of the voltages may be less than 0.0V in other embodiments of the disclosure.

The high logic level driver 310 includes a pull-up driver 312 and a resistance 314. The pull-up driver 310 is provided the voltage VDDQ1 and an output driver data control signal Data2F. When activated by an active Data2F signal (e.g., active when Data2F is a LO level "0"), the pull-up driver 312 provides the voltage VDDQ1 to the resistance 314 to provide a high logic level voltage to the data terminal 21. The resistance 314 may include one or more resistors in some embodiments of the disclosure. The resistance 314 may improve linearity of the output of the high logic level driver 310 when the pull-up driver 312 is activated. The resistance 314 may also provide protection to the pull-up driver 312 from electrostatic discharge (ESD). The pull-up driver 312 is shown in FIG. 3 as including a p-channel transistor. However, in some embodiments of the disclosure, the pull-up driver 312 may include additional and/or alternative circuits, such as other p-channel type transistors, other types of transistors, switches, and the like. The p-channel transistor of the pull-up driver 312 may be configured as a source grounded circuit.

The low logic level driver 320 includes a pull-down driver 322 and a resistance 324. The pull-down driver is provided the voltage VSS and an output driver data control signal Data0. When activated by an active Data0 signal (e.g., active when Data0 is a HI level "1"), the pull-down driver 324 provides the voltage VSS to the resistance 324 to provide a low logic level voltage to the data terminal 21. The resistance 324 may include one or more resistors in some embodiments of the disclosure. The resistance 324 may improve linearity of the output of the low logic level driver 320 when the pull-down driver 322 is activated. The resistance 324 may also provide protection to the pull-down driver 322 from ESD. The pull-down driver 322 is shown in FIG. 3 as including an n-channel transistor. However, in some embodiments of the disclosure, the pull-down driver 322 may include additional and/or alternative circuits, such as other n-channel type transistors, other types of transistors, switches, and the like. The n-channel transistor of the pull-down driver 322 may be configured as a source grounded circuit.

The intermediate logic level driver 330 includes a pull-up middle driver 331 and a pull-down middle driver 332. The pull-up middle driver 331 includes a middle driver 333, a resistance 335, and a cutoff circuit 337. The middle driver 333 is provided an output driver data control signal Data1. The cutoff circuit 337 is provided the voltage VDDQ1 and a control signal LCutF. The voltage VDDQ2 is cutoff to the middle driver 333 when the cutoff circuit 337 is activated by an active LCutF signal (e.g., active when LCutF is a LO level "0"). Conversely, the voltage VDDQ2 is provided to the middle driver 333 when the cutoff circuit 337 is deactivated by an inactive LCutF signal (e.g., inactive when LCutF is a HI level "1"). The pull-up middle driver 331 may be activated by an active Data1 signal (e.g., active when Data1 is a HI level "1") when the LCutF signal is inactive. When activated, the middle driver 333 provides the voltage VDDQ2 to the resistance 335 to provide an intermediate logic level voltage to the data terminal 21.

The resistance 335 may include one or more resistors in some embodiments of the disclosure. The resistance 335 provides protection to the middle driver 333 from ESD. In some embodiments, the pull-up middle driver 331 does not include the resistance 335, for example, where ESD is of less concern. The middle driver 333 is shown in FIG. 3 as including an n-channel transistor. However, in some embodiments of the disclosure, the middle driver 333 may include additional and/or alternative circuits, such as other n-channel type transistors, other types of transistors, switches, and the like. The n-channel transistor of the middle driver 333 may be configured as a source follower circuit. In some embodiments of the disclosure, for example, in the example of FIG. 3, the middle driver 333 includes an n-channel transistor having a relatively low threshold voltage Vt. The lower Vt n-channel transistor may be activated with a relatively lower gate voltage, thereby responding faster to an active Data1 signal.

The cutoff circuit 337 is shown in FIG. 3 as including an n-channel transistor.

However, in some embodiments of the disclosure, the cutoff circuit 337 may include additional and/or alternative circuits, such as other n-channel type transistors, other types of transistors, switches, and the like. In some embodiments of the disclosure, for example, in the example of FIG. 3, the circuit 337 includes an n-channel transistor having a relatively thick gate oxide, and a relatively high threshold voltage Vt. In some embodiments of the disclosure, the n-channel transistor of the cutoff circuit 337 needs a relatively higher gate voltage, for example, 3.0V. An n-channel transistor having the relatively thick gate oxide and relatively high threshold voltage has a relatively high current drive when activated, and relatively low leakage current when deactivated. The cutoff circuit 337 may be used to prevent leakage currents through the middle driver 333, for example, by being activated to cutoff the voltage VDDQ2 from the middle driver 333 when the intermediate logic level driver 330 is not operating. For example, when the intermediate logic level driver 330 is not operating (e.g., no output data operation), an active LCutF signal may be provided to the cutoff circuit 337 to cutoff the voltage VDDQ2 from being provided to the middle driver 333.

The pull-down middle driver 332 includes a middle driver 334, a resistance 336, and a cutoff circuit 338. The middle driver 334 is provided an output driver data control signal Data1F. The Data1F signal is complementary to the Data1 signal provided to the middle driver 333. For example, when the Data1 signal is a HI level "1", the Data1F signal is a LO level "0", and when the Data1 signal is a LO level "0", the Data1F signal is a HI level "1". The cutoff circuit 338 is provided the voltage VDDQ1 and the control signal LCutF. The voltage VDDQ2 is cutoff to the middle driver 334 when the cutoff circuit 338 is activated by an active LCutF signal (e.g., active when LCutF is a LO level "0"). Conversely, the voltage VDDQ2 is provided to the middle driver 334 when the cutoff circuit 338 is deactivated by an inactive LCutF signal (e.g., inactive when LCutF is a HI level "1"). The pull-down middle driver 332 may be activated by an active Data1F signal (e.g., active when Data1F is a LO level "0") when the LCutF signal is inactive. When activated, the middle driver 334 provides the voltage VDDQ2 to the resistance 336 to provide an intermediate logic level voltage to the data terminal 21.

The resistance 336 may include one or more resistors in some embodiments of the disclosure. The resistance 336 provides protection to the middle driver 334 from ESD. In some embodiments, the pull-up middle driver 332 does not include the resistance 336, for example, where ESD is of less concern. The middle driver 334 is shown in FIG. 3 as including a p-channel transistor. However, in some embodiments of the disclosure, the middle driver 334 may include additional and/or alternative circuits, such as other p-channel type transistors, other types of transistors, switches, and the like. The p-channel transistor of the middle driver 334 may be configured as a source follower circuit. In some embodiments of the disclosure, for example, in the example of FIG. 3, the middle driver 334 includes a p-channel transistor having a relatively low threshold voltage Vt. The lower Vt p-channel transistor may be activated with a relatively higher gate voltage, thereby responding faster to an active Data1F signal.

In some embodiments of the disclosure, the resistances 335 and 336 of the pull-up middle driver 331 and the pull-down middle driver 332 and have smaller resistances than the resistance 314 of the high logic level driver 310 and/or the resistance 324 of the low logic level driver 320.

The cutoff circuit 338 is shown in FIG. 3 as including an n-channel transistor. However, in some embodiments of the disclosure, the cutoff circuit 338 may include additional and/or alternative circuits, such as other n-channel type transistors, other types of transistors, switches, and the like. In some embodiments of the disclosure, for example, in the example of FIG. 3, the cutoff circuit 338 includes an n-channel transistor having a relatively thick gate oxide, and a relatively high threshold voltage Vt. In some embodiments of the disclosure, the n-channel transistor for the cutoff circuit 338 needs a relatively higher gate voltage, for example, 3.0V. As previously described with respect to an embodiment of the cutoff circuit 337, an n-channel transistor having the relatively thick gate oxide and relatively high threshold voltage has a relatively high current drive when activated, and relatively low leakage current when deactivated. The cutoff circuit 338 may be used to prevent leakage currents through the middle driver 334, for example, by being activated to cutoff the voltage VDDQ2 from the middle driver 334 when the intermediate logic level driver 330 is not operating. For example, when the intermediate logic level driver 330 is not operating (e.g., no output data operation), an active LCutF signal may be provided to the cutoff circuit 338 to cutoff the voltage VDDQ2 from being provided to the middle driver 334.

In some embodiments of the disclosure, a common deactivation circuit is shared between the pull-up middle driver 331 and the pull-down middle driver 332, rather the pull-up middle driver 331 and the pull-down middle driver 332 (e.g., cutoff circuits 337 and 338) having separate deactivation circuits.

In embodiments of the disclosure where the output driver 300 is included as the output driver 220 in the output buffer 200 of FIG. 2, the output driver data control signals Data0, Data1, Data1F, and Data2F are included in the output driver data control signals 230 provided by the output driver data control logic 210.

FIG. 3 further shows a termination resistance RTT coupled to the data terminal 21 through a conductor 23. In some embodiments of the disclosure, the termination resistance RTT is coupled to the voltage VDDQ2, as shown in the example of FIG. 3. The voltage VDDQ2 is the same voltage provided to the intermediate logic level driver 330. In some embodiments of the disclosure, the voltage coupled to the termination resistance RTT is different than the voltage VDDQ2. For example, the termination resistance RTT may be coupled to the voltage VDDQ1 in some embodiments. The termination resistance RTT may be coupled to the voltage VSS in other embodiments.

In operation, when the LCutF signal is inactive and the cutoff circuits 337 and 338 are deactivated to provide VDDQ1 to the middle drivers 333 and 334, the output driver 300 provides an output data signal based on the output driver data control signals Data0, Data1, Data1F, and Data2F. The output data signal has a high logic level voltage corresponding to a high logic level (HIGH), a low logic level voltage corresponding to a low logic level (LOW), or an intermediate logic level voltage corresponding to an intermediate logic level (MID). The high logic level voltage may be provided using the voltage VDDQ1. The low logic level voltage may be provided by using the voltage VSS. The intermediate logic level voltage may be provided by using the voltage VDDQ2.

Table 2 shows the output driver data control signals and the corresponding logic level of an output data signal for the output driver 300.

TABLE 2

| Data0 | Data1 | Data1F | Data2F | DQ |
|---|---|---|---|---|
| HI | LO | HI | HI | LOW |
| LO | HI | LO | HI | MID |
| LO | LO | HI | LO | HIGH |

Figure 4:
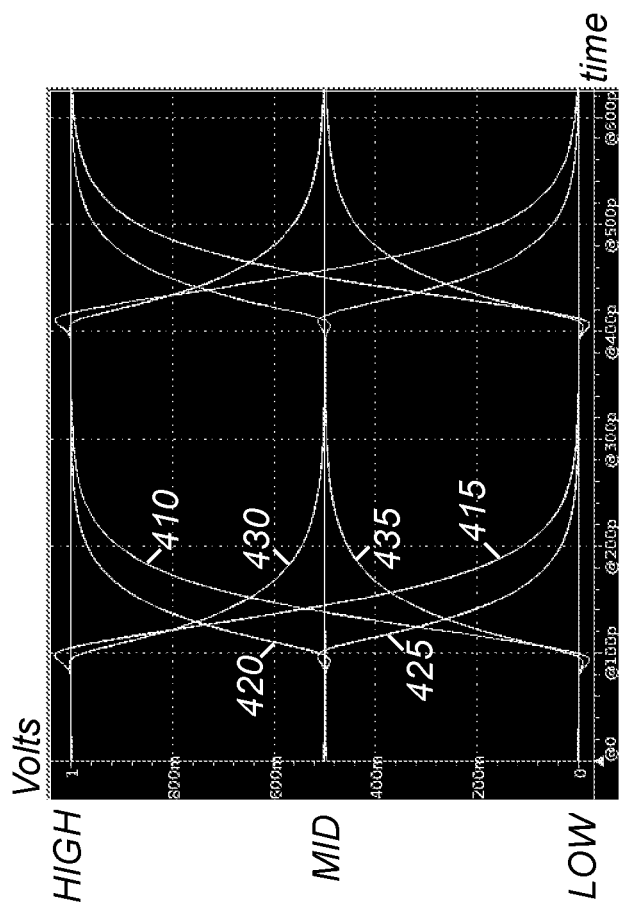
FIG. 4 is a signal diagram showing the output data signal transitioning between the different logic level voltages for an output driver according to an embodiment of the disclosure.

FIG. 4 is a signal diagram showing the output data signal transitioning between the different logic level voltages for an output driver according to an embodiment of the disclosure. In some embodiments, the signal diagram of FIG. 4 represents the output data signal provided by the output driver 300 of FIG. 3.

FIG. 4 shows the output data signal transition between the different logic level voltages provided by VDDQ1, VDDQ2, and VSS. In the example of FIG. 4, the high logic level voltage corresponding to a HIGH logic level is shown as 1.0V, the intermediate logic level voltage corresponding to a MID logic level is shown as 0.5V, and the low logic level voltage corresponding to a LOW logic level is shown as 0.0V. While in some embodiments the magnitude of the logic level voltages for the HIGH, MID, and LOW logic levels are as shown for the example of FIG. 4, in some embodiments of the disclosure the magnitudes for one or more of the logic level voltages are different. For example, in some embodiments of the disclosure, the logic level voltage for the HIGH is less than shown for the example of FIG. 4 and the logic level voltage for the LOW is higher than shown for the example of FIG. 4. In some embodiments of the disclosure, the logic level voltages for the HIGH and MID logic levels are less than shown for the example of FIG. 4. In some embodiments of the disclosure, the high logic level voltage is a positive voltage, the low logic level voltage is a negative voltage, and the magnitude of the intermediate logic level voltage is between the VDDQ1 and VSS voltages.

Example operations of the output driver 300 will be described with reference to FIG. 3, Table 2, and FIG. 4. However, operations of the output driver 300 of FIG. 3 are not limited to that described with reference to FIG. 4.

In an example operation of the output driver 300, to transition the output data signal from a low logic level voltage to a high logic level voltage, the Data0, Data1, Data1 F, Data2F signals received by the output driver 300 are changed from HI, LO, HI, HI to LO, LO, HI, LO. As a result of changing the Data0, Data1, Data1F, Data2F signals, the activated low logic level driver 320 is deactivated and the deactivated high logic level driver 310 is activated. The deactivated intermediate logic level driver 330 remains deactivated. The transition of the output data signal provided by the output driver 300 from a low logic level voltage to a high logic level voltage may be represented by the signal 410 of FIG. 4.

To transition the output data signal from a high logic level voltage to a low logic level voltage, the Data0, Data1, Data1F, Data2F signals received by the output driver 300 are changed from LO, LO, HI, LO to HI, LO, HI, HI. As a result of changing the Data0, Data1, Data1F, Data2F signals, the activated high logic level driver 310 is deactivated and the deactivated low logic level driver 320 is activated. The deactivated intermediate logic level driver 330 remains deactivated. The transition of the output data signal provided by the output driver 300 from a high logic level voltage to a low logic level voltage may be represented by the signal 415.

To transition the output data signal from an intermediate logic level voltage to a high logic level voltage, the Data0, Data1, Data1 F, Data2F signals received by the output driver 300 are changed from LO, HI, LO, HI to LO, LO, HI, LO. As a result, the activated intermediate logic level driver 330 is deactivated and the deactivated high logic level driver 310 is activated. The deactivated low logic level driver 320 remains deactivated. The transition of the output data signal provided by the output driver 300 from an intermediate logic level voltage to a high logic level voltage may be represented by the signal 420.

To transition the output data signal from an intermediate logic level voltage to a low logic level voltage, the Data0, Data1, Data1 F, Data2F signals received by the output driver 300 are changed from LO, HI, LO, HI to HI, LO, HI, HI. As a result, the activated intermediate logic level driver 330 is deactivated and the deactivated low logic level driver 320 is activated. The deactivated high logic level driver 310 remains deactivated. The transition of the output data signal provided by the output driver 300 from an intermediate logic level voltage to a low logic level voltage may be represented by the signal 425.

To transition the output data signal from a high logic level voltage to an intermediate logic level voltage, the Data0, Data1, Data1 F, Data2F signals received by the output driver 300 are changed from LO, LO, HI, LO to LO, HI, LO, HI. As a result, the activated high logic level driver 310 is deactivated and the deactivated intermediate logic level driver 330 is activated. The deactivated low logic level driver 320 remains deactivated. The transition of the output data signal provided by the output driver 300 from a high logic level voltage to an intermediate logic level voltage may be represented by the signal 430.

To transition the output data signal from a low logic level voltage to an intermediate logic level voltage, the Data0, Data1, Data1 F, Data2F signals received by the output driver 300 are changed from HI, LO, HI, HI to LO, HI, LO, HI. As a result, the activated low logic level driver 320 is deactivated and the deactivated intermediate logic level driver 330 is activated. The deactivated high logic level driver 310 remains deactivated. The transition of the output data signal provided by the output driver 300 from a low logic level voltage to an intermediate logic level voltage may be represented by the signal 435.

When the output data signal transitions from either the low logic level voltage or the high logic level voltage to the intermediate logic level voltage (e.g., transitions from the LOW logic level to the MID logic level, or transitions from the HIGH logic level to the MID logic level), the Data1 and Data1F signals are both active to activate both the pull-up middle driver 331 and the pull-down middle driver 332 of the intermediate logic level driver 330. An intermediate logic level driver 330 including both the pull-up middle driver 331 and the pull-down middle driver 332 has a relatively linear voltage-current response over a range of operating voltages for the output data signal. A relatively linear response may improve margin between the different logic levels, as will be described in more detail with reference to FIG. 5.

Additionally, output drivers including an intermediate logic level driver for providing an output data signal having an intermediate logic level voltage may reduce power consumption compared to output drivers that use pull-up and pull-down drivers to provide the intermediate logic level voltage. For example, where the data terminal is terminated by coupling to a termination resistance, and the termination resistance is coupled to a voltage that is the same as the intermediate logic level voltage, current consumption by the output driver may be reduced when providing an output data signal having the intermediate logic level voltage. The intermediate logic level driver of the output driver may consume less current than using the pull-up and pull-down drivers to provide the output data signal having the intermediate logic level voltage.

With reference to FIG. 3, when the LCutF signal is active the cutoff circuits 337 and 338 are activated to cutoff the voltage VDDQ2 from the middle drivers 333 and 334, respectively, thus effectively disabling the intermediate logic level driver 330. As a result, the output driver provides an output data signal based on the output driver data control signals Data0 and Data2F. For example, the output data signal has a high logic level voltage corresponding to a high logic level (HIGH) when the Data0 signal is LO and the Data2F signal is LO. The output data signal has a low logic level voltage corresponding to a low logic level (LOW) when the Data0 signal is HI and the Data2F signal is HI. The high logic level voltage may be provided by using the voltage VDDQ1 and the low logic level voltage may be provided by using the voltage VSS. In another example, when the Data2F signal is maintained to HI, the high logic level driver 310 is effectively disabled. As a result, the output driver provides an output data signal based on the output driver data control signals Data0, Data1 and Data1 F. For example, the output data signal has an intermediate logic level voltage corresponding to an intermediate logic level (MID) when the Data0 signal is LO, the Data 1 signal is HI and the Data1F signal is LO. The output data signal has a low logic level voltage corresponding to a low logic level (LOW) when the Data0 signal is HI, the Data1 signal is LO and the Data1 F signal is HI. The intermediate logic level voltage may be provided by using the voltage VDDQ2 and the low logic level voltage may be provided by using the voltage VSS.

The output data signals shown in FIG. 4 assume the data terminal is unterminated, that is, the data terminal to which the output driver provides the output data signal is not coupled to a termination resistance. Where the data terminal is terminated (e.g., coupled to a termination resistance), the transitions of the output data signal between logic level voltages may be different than that shown in FIG. 4. For example, the output data signal may transition more quickly from one logic level voltage to another than shown in FIG. 4 when the data terminal is coupled to a termination resistance. While the transitions of the output data signal between logic level voltages may be different when the data terminal is terminated, operation of the output driver as described for the previous example remains the same.

Figure 5:
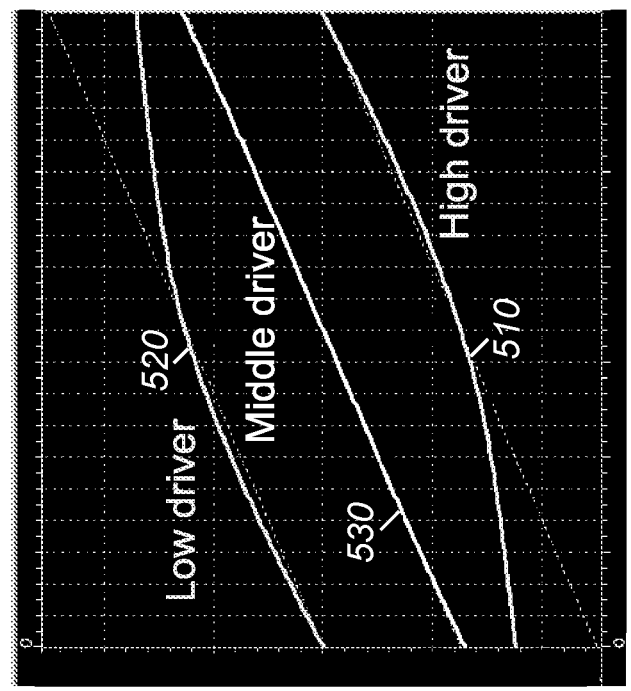
FIG. 5 is a diagram showing example voltage-current response of an output driver according to an embodiment of the disclosure.

FIG. 5 is a diagram showing example voltage-current response for an output driver according to an embodiment of the disclosure. A range of operating voltage ("DQ pin level") is shown with resulting output current ("DQ pin current"). Line 510 represents a voltage-current response for a high logic level driver ("High driver"), line 520 represents a voltage-current response for a low logic level driver ("Low driver"), and line 530 represents a voltage-current response for an intermediate logic level driver ("Middle driver"). In some embodiments of the disclosure, the signal diagram of FIG. 5 may represent a voltage-current response for the output driver 300 of FIG. 3. For example, in such embodiments the line 510 represents the voltage-current response for the high logic level driver 310, the line 520 represents the voltage-current response for the low logic level driver 320, and the line 530 represents the voltage-current response for the intermediate logic level driver 330.

As shown in FIG. 5, while the low logic level driver 320 has a voltage-current response that tails off for higher operating voltages for the output data signal and the high logic level driver 310 has a voltage-current response that tails off for lower operating voltages of the output data signal, the voltage-current response 530 for the intermediate logic level driver 330 is relatively linear over the range of operating voltage for the output data signal at a data terminal. The range of operating voltage may be, for example, in some embodiments of the disclosure, between 0.0V and 1.0V. The linear response of the intermediate logic level driver 330 provides better margin between the low and high logic levels compared to a less linear response for the intermediate logic level driver 330.

The relatively linear response of the intermediate logic level driver 330 may result from including a pull-up middle driver and a pull-down middle driver, for example, as previously described with reference to the intermediate logic level driver 330. The middle drivers of the pull-up and pull-down middle drivers may provide additional current capacity for each other when transitioning the output data signal from either the high or low logic level voltages to the intermediate logic level voltage.

For example, with reference to the intermediate logic level driver 330 of FIG. 3, the middle driver 333 (including an n-channel transistor) of the pull-up middle driver 331 may provide additional current drive to the middle driver 334 (including a p-channel transistor) of the pull-down middle driver for transitioning the output data signal from a low logic level voltage of a LOW logic level to the intermediate logic level voltage of a MID logic level. Whereas the p-channel transistor of the middle driver 334 may have relatively lower current capacity for lower output data signal voltages at the data terminal, the re-channel transistor of the middle driver 333 provides additional current capacity to assist driving (e.g., pulling up) the output data signal voltage from the low logic level voltage to the intermediate logic level voltage. Conversely, the middle driver 334 may provide additional current driver to the middle driver 333 for transitioning the output data signal from a high logic level voltage of a HIGH logic level to the intermediate logic level voltage of a MID logic level. Whereas the n-channel transistor of the middle driver 333 may have relatively lower current capacity for higher output data signal voltages at the data terminal, the p-channel transistor of the middle driver 334 provides additional current capacity to assist driving (e.g., pulling down) the output data signal voltage from the high logic level voltage to the intermediate logic level voltage.

Although various embodiments of the disclosure have been disclosed, it will be understood by those skilled in the art that the embodiments extend beyond the specifically disclosed embodiments to other alternative embodiments and/or uses and obvious modifications and equivalents thereof. In addition, other modifications which are within the scope of this disclosure will be readily apparent to those of skill in the art based on this disclosure. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying mode of the disclosed embodiments. Thus, it is intended that the scope of at least some of the present disclosure should not be limited by the particular disclosed embodiments described above.

From the foregoing it will be appreciated that, although specific embodiments of the disclosure have been described herein for purposes of illustration, various modifications may be made without deviating from the spirit and scope of the disclosure. Accordingly, the scope of the disclosure should not be limited any of the specific embodiments described herein.

What is claimed is:

1. An apparatus, comprising:
   a high logic level driver coupled to a data terminal and configured to be provided a first voltage, the high logic level driver configured to provide a high logic level voltage to the data terminal when activated;
   a low logic level driver coupled to the data terminal and configured to be provided a second voltage, the low logic level driver configured to provide a low logic level voltage to the data terminal when activated; and
   an intermediate logic level driver coupled to the data terminal and configured to be provided a third voltage having a magnitude that is between the first and second voltages, the intermediate logic level driver configured to provide an intermediate logic level voltage to the data terminal when activated,
   wherein each of the high logic level driver, the low logic level driver, and the intermediate logic level driver are configured to be respectively activated based on one or more of a plurality of control signals, wherein the intermediate logic level driver comprises:
   a pull-up middle driver configured to provide the intermediate logic level voltage to the data terminal when activated; and
   a pull-down middle driver configured to provide the intermediate logic level voltage to the data terminal when activated,
   wherein the pull-up middle driver and the pull-down middle driver are further configured to be concurrently activated.

2. The apparatus of claim 1 wherein the pull-up middle driver comprises:
   a resistance coupled to the data terminal;
   a first transistor coupled to the resistance and having a relatively low threshold voltage; and a second transistor coupled to the first transistor and configured to be provided the third voltage, the second transistor having a relatively high threshold voltage.

3. The apparatus of claim 2 wherein the pull-down middle driver comprises:
   a second resistance coupled to the data terminal;
   a third transistor coupled to the second resistance and having a relatively low threshold voltage; and
   a fourth transistor coupled to the third transistor and configured to be provided the third voltage, the fourth transistor having a relatively high threshold voltage.

4. The apparatus of claim 3 wherein the first transistor comprises a transistor of a first channel-type and wherein the third transistor comprises a transistor of a second channel-type, the second channel type different than the first channel-type.

5. The apparatus of claim 1 wherein the data terminal is configured to be coupled to a termination resistance, the termination resistance configured to be provided the first voltage, the second voltage, or the third voltage.

6. The apparatus of claim 1 wherein:
   the high logic level driver includes a first transistor, the first transistor is a first channel-type transistor;
   the low logic level driver includes a second transistor, the second transistor is a second channel-type transistor; and
   the intermediate logic level driver includes third and fourth transistors, the third transistor is a second channel-type transistor and the fourth transistor is a first channel-type transistor.

7. An apparatus, comprising:
   output driver data control logic configured to be provided a plurality of data bits and provide output driver data control signals based on the plurality of data bits; and
   an output driver coupled to the output driver data control logic and including a first logic level driver, a second logic level driver, and a third logic level driver, the output driver configured to receive the output driver data control signals, and based on the output driver data control signals configured to:
      provide a first logic level voltage with an activated first logic level driver, and deactivated second and third logic level drivers,
      provide a second logic level voltage with an activated second logic level driver, and deactivated first and third logic level drivers, and
      provide a third logic level voltage with an activated third logic level driver, and deactivated first and second logic level drivers,
   wherein the third logic level voltage has a magnitude between the first and second logic level voltages.

8. The apparatus of claim 7 wherein:
   the first logic level driver is configured to be activated responsive to an active first control signal of the output driver data control signals;
   the second logic level driver is configured to be activated responsive to an active second control signal of the output driver data control signals; and
   the third logic level driver configured to be activated responsive to an active third control signal and an active fourth control signal of the output driver data control signals, the third and fourth control signals are complementary.

9. The apparatus of claim 8 wherein the third logic level driver comprises a first resistance and a first middle driver coupled to the first resistance and further comprises a second resistance and a second middle driver coupled to the second resistance, the first middle driver configured to be activated responsive to an active high third control signal and the second middle driver configured to be activated responsive to an active low fourth control signal.

10. The apparatus of claim 7 wherein:
   the first logic level driver is configured to be activated responsive to a low level first control signal of the output driver data control signals;
   the second logic level driver is configured to be activated responsive to a high level second control signal of the output driver data control signals; and
   the third logic level driver configured to be activated responsive to a low level third control signal and a high level fourth control signal of the output driver data control signals.

11. The apparatus of claim 7 wherein the third logic level driver comprises a pull-up middle driver and a pull-down middle driver, the pull-up and pull-down middle drivers both activated to provide the third logic level voltage.

12. A method for providing an output data signal, comprising:
   providing the output data signal having a first logic level voltage with an activated first logic level driver, and deactivated second and third logic level drivers;
   providing the output data signal having a second logic level voltage with an activated second logic level driver, and deactivated first and third logic level drivers; and
   providing a third logic level voltage with an activated third logic level driver, and deactivated first and second logic level drivers,
   wherein the third logic level voltage has a magnitude between the first and second logic level voltages.

13. The method of claim 12 wherein providing the third logic level with the activated third logic level driver comprises:
   activating a first transistor configured to be provided a voltage; and
   activating a second transistor configured to be provided the voltage,
   wherein the first transistor activated responsive to a first control signal having a first level and the second transistor activated responsive to a second control signal having a second level, the first and second levels complementary.

14. The method of claim 13 wherein providing the output data signal having the first logic level voltage with the activated first logic level driver comprises activating the first logic level driver responsive to a third control signal having the second level.

15. The method of claim 13 wherein providing the output data signal having the second logic level voltage with the activated second logic level driver comprises activating the second logic level driver responsive to a fourth control signal having the first level.

16. A method, comprising:
   receiving output driver data control signals at an output driver;
   responsive to the output driver data control signals,
      activating a high logic level driver to provide a high logic level voltage to a data terminal,
      activating a low logic level driver to provide a low logic level voltage to the data terminal, or
      activating an intermediate logic level driver to provide an intermediate logic level voltage to the data terminal, wherein providing the intermediate logic level voltage to the data terminal comprises deactivating the high and low logic level drivers.

17. The method of claim 16, further comprising providing the output driver data control signals based on a plurality of data bits.

18. The method of claim 16, wherein activating the high logic level driver comprises activating a p-channel transistor to provide a first voltage to a resistor coupled to the data terminal.

19. The method of claim 18 wherein activating the low logic level driver comprises activating an n-channel transistor to provide a second voltage to the resistor coupled to the data terminal.

20. The method of claim 16, wherein activating the intermediate logic level driver comprises:
activating a p-channel transistor to provide a voltage to a first resistor coupled to the data terminal; and
activating an n-channel transistor to provide the voltage to a second resistor coupled to the data terminal.

21. A method for transitioning an output data signal at a data terminal between first, second, and third logic level voltages, comprising:
to transition the output data signal from the first logic level voltage to the second logic level voltage, deactivating a first transistor coupled to the data terminal and provided a first level voltage and activating a second transistor coupled to the data terminal and provided a second level voltage;
to transition the output data signal from the second logic level voltage to the first logic level voltage, deactivating the second transistor and activating the first;
to transition the output data signal from the first logic level voltage to the third logic level voltage, deactivating the first transistor, and activating third and fourth transistors coupled to the data terminal and each provided a third level voltage;
to transition the output data signal from the second logic level voltage to the third logic level voltage, deactivating the second transistor, and activating the third and fourth transistors;
to transition the output data signal from the third logic level voltage to the first logic level voltage, deactivating the third and fourth transistors and activating the first transistor; and
to transition the output data signal from the third logic level voltage to the second logic level voltage, deactivating the third and fourth transistors and activating the second transistor.

22. The method of claim 21 wherein the first level voltage has a magnitude greater than the second level voltage and the third level voltage has a magnitude between the first and second level voltages.

* * * * *